(12) United States Patent
Sato et al.

(10) Patent No.: US 6,685,777 B2
(45) Date of Patent: Feb. 3, 2004

(54) PASTE APPLICATOR AND PASTE APPLICATION METHOD FOR DIE BONDING

(75) Inventors: Seiichi Sato, Fukuoka (JP); Hitoshi Mukojima, Fukuoka (JP); Nobuyuki Iwashita, Fukuoka (JP); Nobuyuki Suefuji, Fukuoka (JP); Mitsuru Ozono, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 181 days.

(21) Appl. No.: 09/998,526

(22) Filed: Nov. 28, 2001

(65) Prior Publication Data

US 2002/0037372 A1 Mar. 28, 2002

Related U.S. Application Data

(62) Division of application No. 09/544,385, filed on Apr. 6, 2000, now Pat. No. 6,361,831.

(30) Foreign Application Priority Data

Apr. 6, 1999 (JP) .......................................... 11-098562

(51) Int. Cl.[7] ............................................... B05C 11/00
(52) U.S. Cl. ....................................... 118/669; 118/410
(58) Field of Search ................................ 118/669, 679, 118/712, 323, 410, 684, 695, 696, 697, 698, 702, 704, 664; 156/356, 64; 901/43

(56) References Cited

U.S. PATENT DOCUMENTS

| 5,022,556 A | * | 6/1991 | Dency |
| 5,348,585 A | * | 9/1994 | Weston |
| 5,782,410 A | * | 7/1998 | Weston |
| 6,348,234 B1 | * | 2/2002 | Ozono et al. |

\* cited by examiner

*Primary Examiner*—Brenda A. Lamb
(74) *Attorney, Agent, or Firm*—RatnerPrestia (57) ABSTRACT

A paste applicator and paste application method for die bonding apply paste to adhere a semiconductor chip on a substrate. Data on paste application volume and application pattern which can be identified from paste thickness and chip size are stored. A dispensing flow rate calculator calculates dispensing flow rate of a dispenser based on the paste application volume data and application pattern data when the paste is dispensed from the dispenser and pressure fed to an application nozzle for applying paste. Based on this calculated dispensing flow rate and application pattern data, a dispenser controller controls the dispenser and a transfer table controller controls the transfer table for moving the application nozzle.

10 Claims, 8 Drawing Sheets

PASTE APPLICATOR AND PASTE APPLICATION METHOD FOR DIE BONDING

This application is a divisional of U.S. patent application Ser. No. 09/544,385, filed Apr. 6, 2000 now U.S. Pat. No. 6,361,831.

FIELD OF THE INVENTION

The present invention relates to the field of paste applicators and paste application methods for applying paste onto substrates such as lead frames for die bonding.

BACKGROUND OF THE INVENTION

In the die bonding process used in the manufacture of semiconductor devices, paste is applied to a substrate such as a lead frame for attaching semiconductor chips. The paste is applied to an application area on the substrate by dispensing the paste from a dispenser to an application nozzle, and then onto the substrate. One known application method is plotting, in which paste is applied by moving the application nozzle in the application area while dispensing the paste.

Since the volume of paste required varies according to the types and sizes of target chips, application patterns including plotting patterns and application nozzle moving speed patterns need to be set for each target chip before plotting can be carried out. However, conventional paste applicators require a painstaking process for setting application patterns every time in the above plotting application, involving complicated data input. In addition, if patterns are not appropriately set, the required application quality may not be achieved.

SUMMARY OF THE INVENTION

A paste applicator for die bonding of the present invention applies paste onto a substrate for attaching a semiconductor chip on the substrate, and includes an application nozzle which dispenses paste from an application opening to apply the paste on the substrate; a transfer table for moving the application nozzle relative to the substrate; a dispenser which dispenses the paste for pressure feeding the paste to the application nozzle; a dispensing flow rate calculator for calculating the dispensing flow rate of the dispenser based on data on volume of the paste to be applied to the substrate and data on application pattern; and a controller for controlling the dispenser and transfer table based on calculated flow rate and the data on application pattern for applying the paste.

A paste application method for die bonding of the present invention applies paste for attaching a semiconductor chip on the substrate by pressure feeding the paste dispensed from the dispenser to the application nozzle and then dispensing the paste from the application opening of the application nozzle. The dispensing flow rate calculator calculates the dispensing flow rate of the dispenser based on data on amount of paste to be applied to the substrate and data on application pattern, and controls the transfer table for moving the dispenser and application nozzle based on this calculated dispensing flow rate and data on the application pattern.

The present invention improves operability and secures application quality by calculating the dispensing flow rate of the dispenser based on data on volume of paste to be applied to the substrate and data on the application pattern with the dispense flow rate calculator, and controlling the transfer table which moves the dispenser and application nozzle based on this calculated dispensing flow rate and data on the application pattern.

DESCRIPTION OF THE PREFERRED EMBODIMENT

A paste applicator and paste application method for die bonding in accordance with a preferred embodiment of the present invention are described below with reference to FIGS. 1 to 8D.

Figure 1:
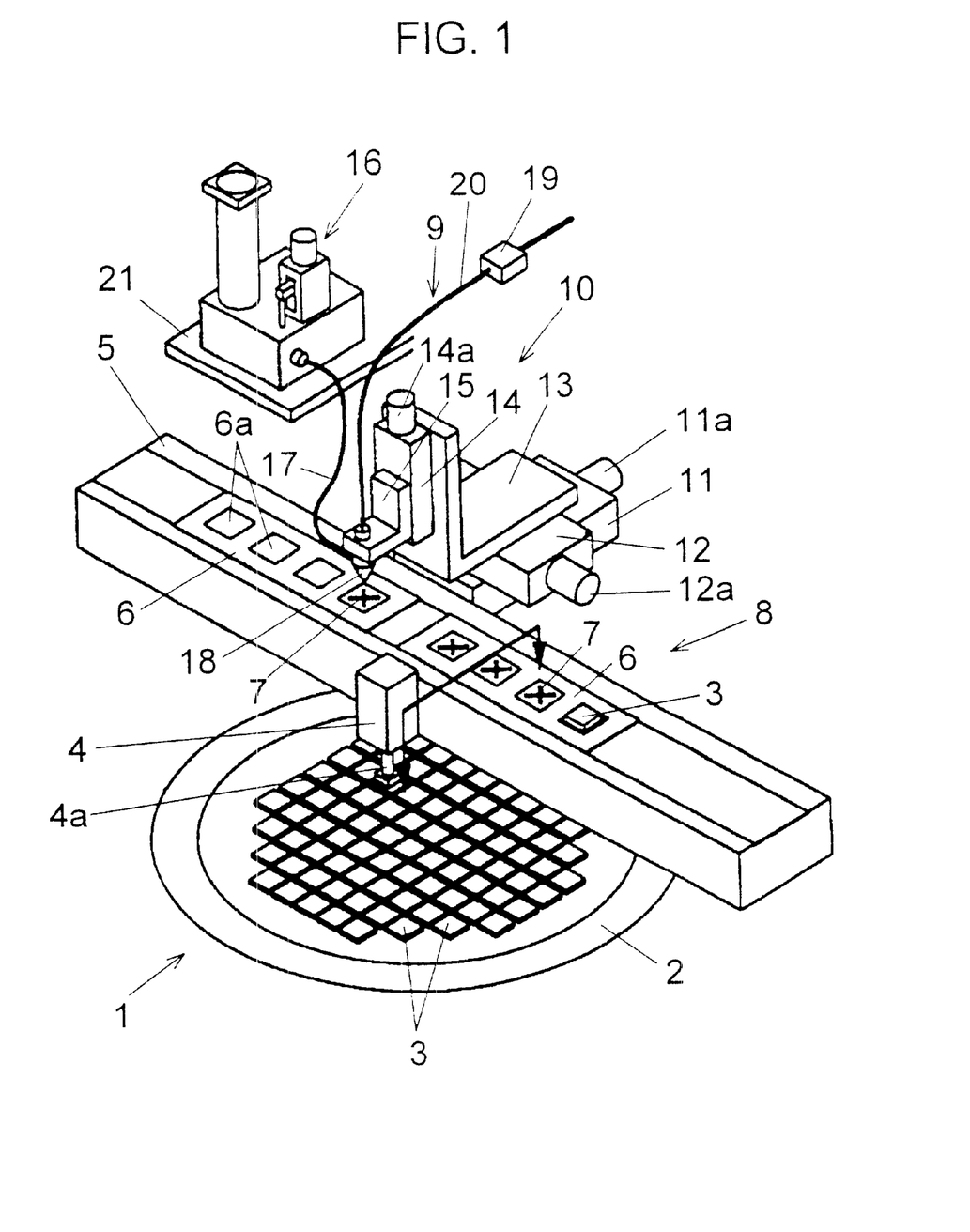
FIG. 1 is a perspective view of a die bonder in accordance with a preferred embodiment of the present invention.

First, a configuration of a die bonder in the preferred embodiment of the present invention is described with reference to FIG. 1. In FIG. 1, a wafer sheet 2 is placed on a chip feeder 1 by means of a holding table (not illustrated). Many chips 3, which are semiconductor devices, are attached to the wafer sheet 2. A carrier 5 is disposed at the side of the chip feeder 1. The carrier 5 transports a lead frame 6, which is a substrate, and positions the lead frame 6 in the paste application position and bonding position. A bonding head 4 is disposed above the chip feeder 1. The bonding head 4 moves horizontally or vertically by means of a transfer mechanism which is not illustrated in FIG. 1.

A paste application unit 9 is disposed at the side of the carrier 5. The paste application unit 9 includes an application nozzle 18 attached to the transfer table 10 with an L bracket 15. A flexible tube 17 connects the application nozzle 18 to a dispenser 16 mounted on a fixed plate 21. An air tube 20 also connects the application nozzle 18 to a dispensing control valve 19. When the dispenser 16 is driven, the paste is pressure fed to the application nozzle 18 through the tube 17. The paste is then dispensed from the application opening provided at the lower end of the application nozzle 18 onto an application area 6a of the lead frame 6. The dispensing control valve 19 controls the period of dispensing the paste from the application nozzle 18.

The transfer table 10 includes an X axis table 12 on a Y axis table 11, and a Z axis table 14 is vertically connected to the X axis table 12 with an L bracket 13. The Y axis table 11, X axis table 12, and Z axis table 14 respectively have a Y axis motor 11a, X axis motor 12a, and Z axis motor 14a. The application nozzle 18 moves horizontally or vertically over the lead frame 6 by driving the X axis motor 12a, Y axis motor 11a, and Z axis motor 14a. Accordingly, the transfer table 10 moves the application nozzle 18 relative to the lead frame 6.

A chip bonding area 6a of the chip 3 on an upper face of the lead frame 6 on which the chip will be bonded is the application area 6a where the paste is applied. The application nozzle 18 is positioned in the application area 6a, and moves while dispensing the paste for applying paste 7 in a cross mark application pattern to the application area 6a of a target chip placed on the surface of the lead frame 6.

After applying the paste, the lead frame 6 is transferred on the carrier 5 to a bonding position 8, and is positioned. A nozzle 4a of the bonding head 4 picks up the chip 3 from the chip feeder 1, and places it on the paste 7 applied in the application area 6a for bonding the chip 3.

Figure 2:
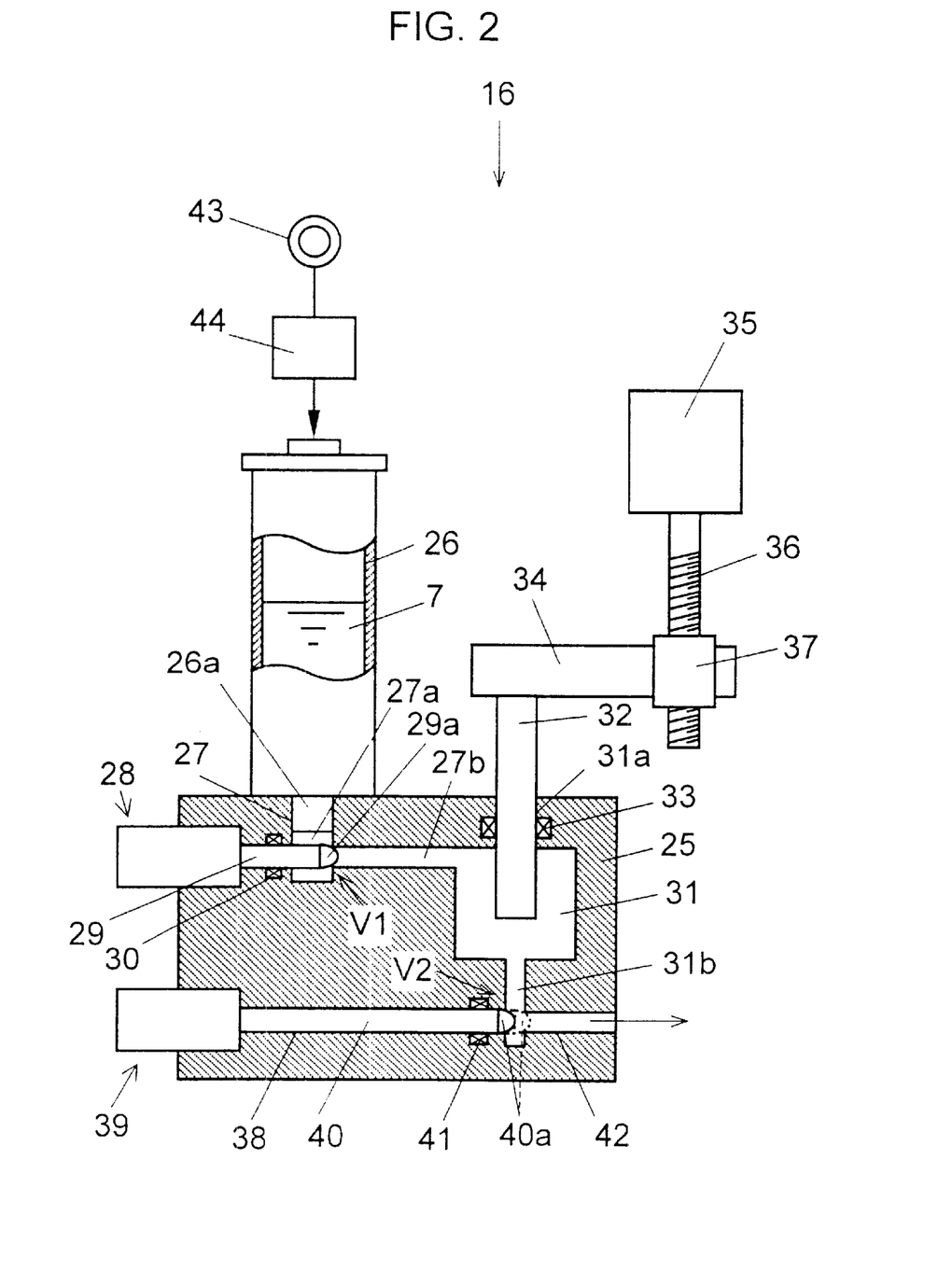
FIG. 2 is a sectional view of a dispenser for dispensing paste in accordance with the preferred embodiment of the present invention.

Next, a configuration of the dispenser 16 in the preferred embodiment of the present invention is described with reference to FIG. 2. In FIG. 2, a syringe 26 which is a container for storing the paste 7 is mounted on an upper face of a manifold block 25. A lower end 26a of the syringe 26 is fitted into an inner hole 27 created on the manifold block 25. Inside the syringe 26 is thus linked to space 27a. A horizontal inner hole 27b is linked to the space 27a, and the inner hole 27b is linked to space 31.

A reciprocating mechanism 28, working in reciprocating fashion, inserts a stem 29 into the space 27a. An end of the inner hole 27b is closed with a sealing face 29a by protruding the stem 29. The stem 29 and inner hole 27a compose the first valve V1. The sliding face of the stem 29 is sealed with a sealing member 30 to prevent the leaked paste 7 from the syringe 26 to the space 27a from flowing outside.

A piston 32 is fitted into an inner hole 31a created on the manifold block 25 and is inserted to the space 31. The sliding face of the piston 32 is sealed with a sealing member 33. The piston 32 is held with a holding member 34, and the piston 32 moves in and out of the space 31 by reciprocating the holding member 34 with a reciprocating unit including a motor 35, feeding screw 36, and nut 37. Other configurations for the reciprocating unit are acceptable as long as the position or speed of the piston 32 is controllable. A dispensing opening 42 is provided perpendicular to an inner hole 31b provided below the space 31. A stem 40 is fitted in reciprocating fashion by a reciprocating mechanism 39 to an inner hole 38 provided perpendicularly to the inner hole 31b. The sliding face of the stem 40 is sealed with a sealing member 41. A sealing face 40a closes the dispensing opening 42 when the stem 40 is protruded. The stem 40 and dispensing opening 42 compose a valve V2.

The operation of the dispenser 16 is described next. First, an intaking process of filling the space 31 with the paste 7 in the syringe 26 by suction is described. The stem 40 is first protruded to close the second valve V2, and then the stem 29 is retracted to open the first valve V1. In this state, the piston 32 is pulled for intaking the paste 7. Here, the pressure is applied to the paste 7 by supplying air from an air source 43 to the syringe 26 through a control valve 44. In line with the pulling of the piston 32, the paste 7 flows to the space 27a, inner hole 27b, and reaches the space 31. Since the second valve V2 is closed, the space 31 is filled with the paste 7.

Next, the paste dispensing process is described. In the above state, the first valve V1 is closed, the second valve V2 is opened, and the piston 32 is inserted to the space 31. This operation pushes out the paste 7 in the space 31 through the inner hole 31b, and the paste 7 is discharged from the dispensing opening 42. By repeating the above intaking and dispensing processes, the paste in the syringe 26 is intermittently filled into the space 31 and dispensed out from the dispensing opening 42. The dispensed paste 7 is pressure fed to the application nozzle 18 through the tube 17. Here, a dispensing flow rate, which is the dispensing volume per unit time, is adjustable by controlling the revolution of the motor 35 to control the operating speed of the piston 32.

Figure 3A:
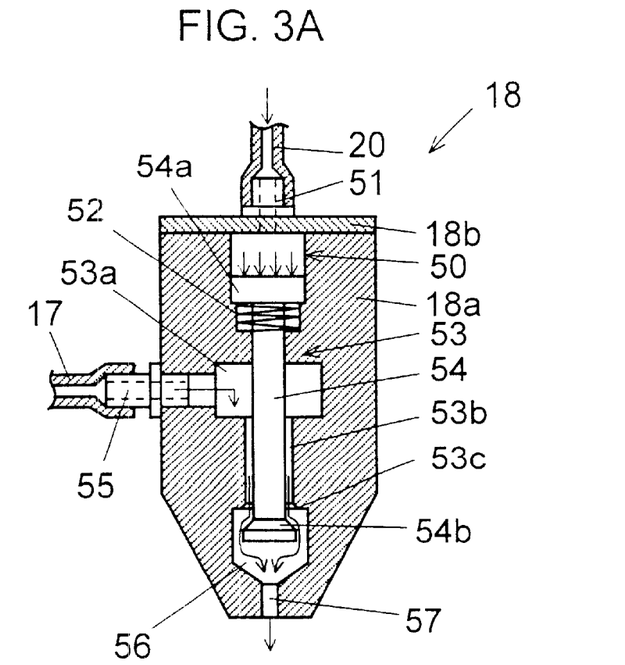
FIG. 3A is a sectional view of a past application nozzle in accordance with the preferred embodiment of the present invention.
Figure 3B:
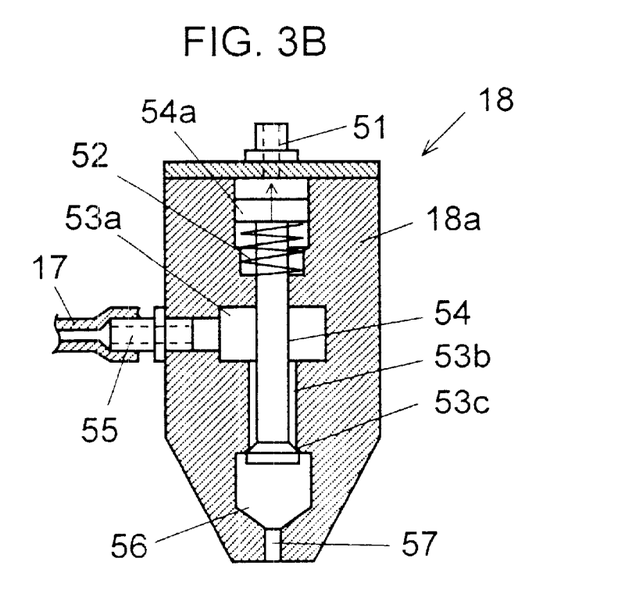
FIG. 3B is a sectional view of a paste application nozzle in accordance with the preferred embodiment of the present invention.

Next, the application nozzle 18 in the preferred embodiment of the present invention is described below with reference to FIGS. 3A and 3B. As shown in FIGS. 3A and 3B, a nozzle block 18a is an approximately cylindrical member whose lower part is processed into a cone shape. A stepped inner hole 53 is provided at the center of the cylinder along the shaft direction. A valve stem 54 is fitted into the inner hole 53 in vertically movable fashion. An upper part of the inner hole 53 is connected to a cylinder 50 where a piston 54a at an upper end of the valve stem 54 is fitted. A spring 52 applies an upward force to the piston 54a. Air is supplied from the air tube 20 through a joint 51 into the cylinder 50 which is closed with a cover member 18b provided on the nozzle block 18a. This air supply applies pressure to the piston 54a to lower the valve stem 54, counteracting the force of the spring 52.

The tube 17 in which the paste 7 is pressure fed through a joint 55 is connected to first space 53a provided at the middle part of the nozzle block 18a. The first space 53a is connected to a second space 56 provided immediately in front of an application opening 57 which dispenses the paste 7 for application through a clearance 53b through which the valve stem 54 passes. The valve stem 54 stretches downward and reaches the second space 56. A tapered sealing face 54b is provided at a lower part of the valve stem 54. As shown in FIG. 3B, the sealing face 54b contacts a valve sheet 53c provided at a lower end of the clearance 53b for closing the lower end of the clearance 53b.

As shown in FIG. 3A, the valve stem 54 is at its lower position when the cylinder 50 is pressurized. The paste 7 pressure fed through the tube 17 is thus dispensed from the dispensing opening 57 through the first space 53a, clearance 53b, and second space 56. Also as shown in FIG. 3B, the stem 54 is at its uppermost position when the pressure applied to the cylinder 50 is released. The valve sheet 53c then closes the clearance 53b to stop dispensing of the paste 7. In other words, the valve stem 54 and valve sheet 53c are provided integrally with the application nozzle 18, and form an opening unit to open and close the application opening 57.

Figure 4:
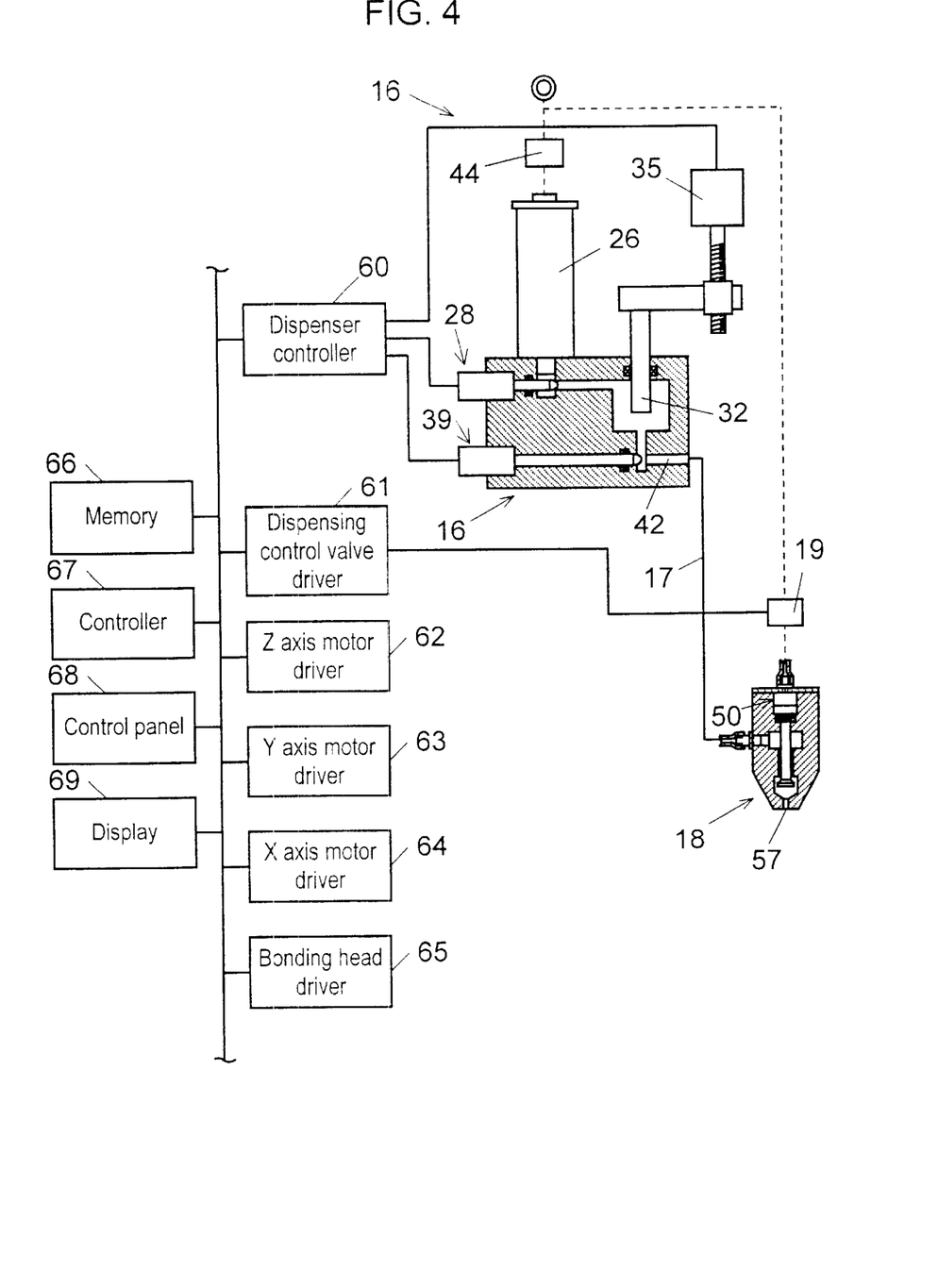
FIG. 4 is a block diagram illustrating a control system of a die bonder in accordance with the preferred embodiment of the present invention.

A control system of the die bonder in the preferred embodiment of the present invention is described next with reference to FIG. 4. In FIG. 4, a dispenser controller 60 controls the motor 35 which drives the piston 32 and the reciprocating mechanisms 28 and 39 which respectively drive the first and second valves to control dispensing of the paste by the dispenser 16. A dispensing control valve driver 61 controls air supplied to the cylinder 50 of the application nozzle 18 by driving the opening and closing of the dispensing control valve 19 that in turn opens and closes the opening unit of the application nozzle 18.

A Z axis motor driver 62, Y axis motor driver 63, and X axis motor driver 64 respectively drive the Z axis motor 14a, Y axis motor 11a, and X axis motor 12a of the transfer table 10 (FIG. 1). A bonding head driver 65 drives the bonding head 4 which bonds the chip 3 (FIG. 1). A memory 66 stores the programs which are used for operating and processing of each unit and data on application patterns. A controller 67 controls the operation of each unit based on programs stored in the memory 66. A control panel 68 is an input unit such as a keyboard or mouse for inputting control commands and data. A display 69 is a display device for displaying input operations on a screen.

Figure 5:
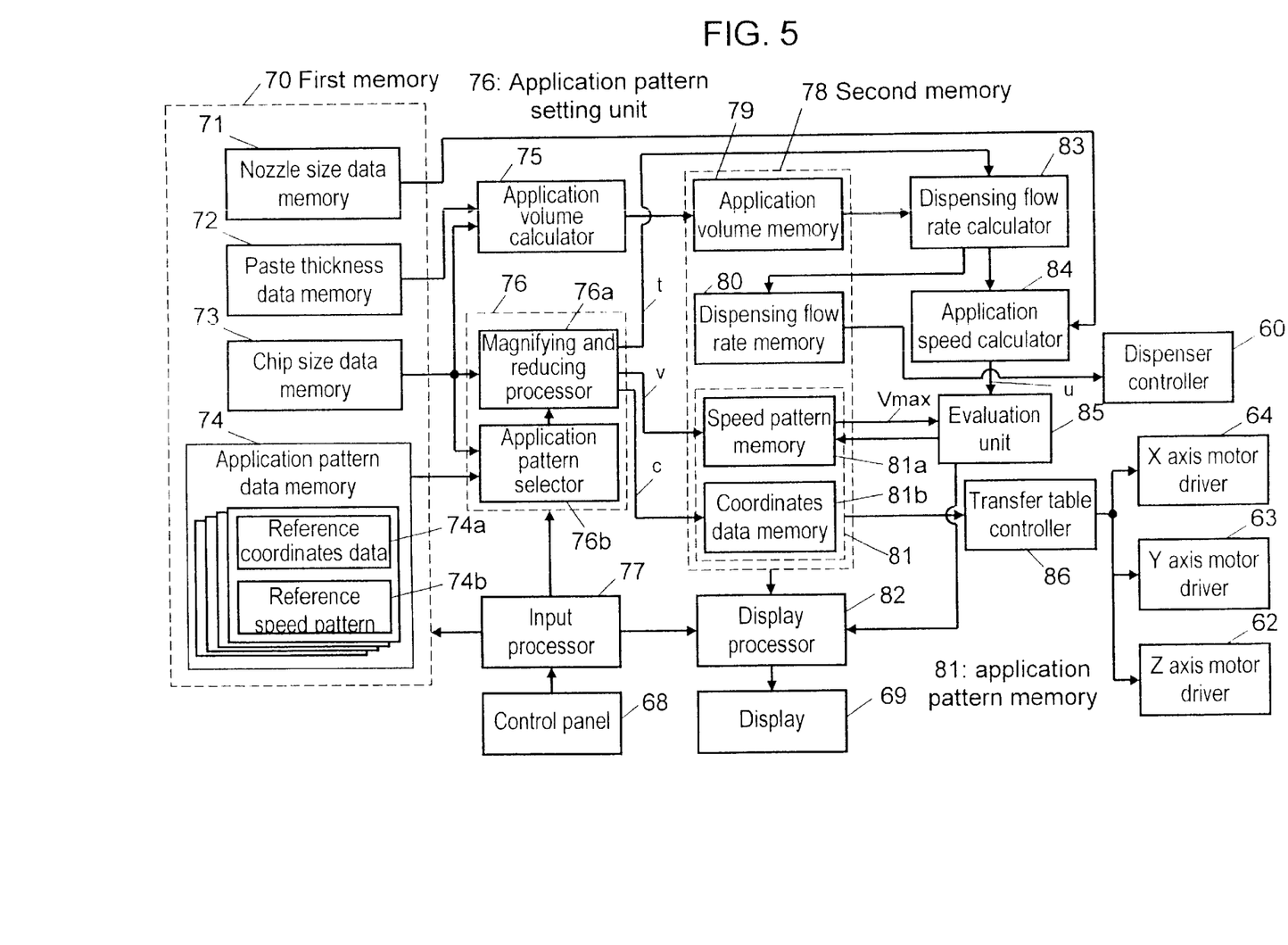
FIG. 5 is a block diagram illustrating a paste application function of a die bonder in the preferred embodiment of the present invention.

Functions of the die bonder in the paste application process is described with reference to FIG. 5. In FIG. 5, blocks 70, 76, and 78 configure a first memory, application pattern setting unit, and second memory. In the elements shown in FIG. 5, an application volume calculator 75, application pattern setting unit 76, input processor 77, display processor 82, dispensing flow rate calculator 83, application speed calculator 84, evaluation unit 85, and transfer table controller 86 are handled with the controller 67 shown in FIG. 4. The first memory 70 and second memory 78 indicate data stored in the memory 66 in FIG. 4.

First, each part configuring the first memory 70 is described. A nozzle size data memory 71 stores data on sizes of the application opening 57 (FIGS. 3A and 3B) which is provided at the lower end of the application nozzle 18 and dispenses the paste. In other words, data such as diameter or sectional area of the application opening 57 is stored. This data is used for calculating the application speed of paste dispensed from the application nozzle 18. A paste thickness data memory 72 stores the thickness of paste TP (FIG. 7) between the bonded lead frame 6 and chip 3 for each target chip. This data is used for calculating volume of paste which is desirably applied to each application area.

A chip size data memory 73 stores data on sizes of target chips. In other words, data on the width and length of the chip 3 is stored. This data is used for calculating application volume, and also as a reference for selecting an application pattern. An application pattern data memory 74 stores application patterns of the paste to be applied to the application area. In other words, it stores two or more application patterns indicating reference coordinates data 74a of application points and application lines and a reference speed pattern 74b in a travel path of the application nozzle 18. FIGS. 8A to 8D show examples of application patterns.

An appropriate application pattern is selected from these plural application patterns based on the chip size and shape (e.g. rectangular or square) at applying the paste.

The input processor 77 processes operation input signals input from the control panel 68, and outputs control commands to each unit, and writes data to the first memory 70. The application volume calculator 75 calculates volume of the paste to be applied to each application area based on the paste thickness data and chip size data stored in the first memory 70. The application volume is calculated by identifying a projected plan area of a chip from the chip size data and multiplying this area by the paste thickness TP indicated in FIG. 7 and a correction factor. Calculation results are stored in an application volume memory 79 in the second memory 78.

The application pattern setting unit 76 includes an application pattern selector 76b and magnifying and reducing processor 76a. The application pattern setting unit 76 selects an application pattern, and matches the selected application pattern with the size of the target chip. More specifically, the application pattern selector 76b selects an appropriate application pattern from several application patterns stored in the application pattern data memory 74 based on the chip size data, and the magnifying and reducing processor 76a implements the desired changes, including magnification and reduction, to match the actual chip size. This magnification and reduction process makes it possible to store only basic reference application patterns, making it possible to handle a variety of chip models using a small portion of reference patterns.

Based on the setting of application patterns, data on application patterns required for controlling actual application operation, i.e., coordinates data c for specifying each application point and application line, a speed pattern v, i.e., the speed on the travel path of the application nozzle 18 moving among application points and application lines, and application time t indicating the time for actually dispensing and applying the paste on the travel path are calculated.

In these sets of data on application patterns, the coordinates data c and speed pattern v are stored respectively in the coordinates data memory 81b and in the speed pattern memory 81a provided in the application pattern memory 81 in the second memory 78. Signals on coordinates data and speed pattern are output to the transfer table controller 86, and the transfer table controller 86 controls the X axis motor driver 64, Y axis motor driver 63, and Z axis motor driver 62 based on the coordinates data and speed pattern. Accordingly, the application nozzle 18 moves with the transfer table 10 along the travel path of the application pattern.

Data on application time t in the application patterns is used for calculating dispensing flow rate by the dispensing flow rate calculator 83. In other words, the dispensing flow rate calculator 83 calculates the dispensing flow rate which is the dispensed volume per unit time required for the dispenser 16 by dividing the application volume stored in the application volume memory 79 by the application time t. The dispensing flow rate calculator 83 thus calculates the dispensing flow rate of the dispenser 16 (FIG. 2) based on data on the application volume of the paste and the data on application pattern.

These calculation results are stored in a dispensing flow rate memory 80. Stored data on dispensing flow rate is sent to the dispenser controller 60 (see FIG. 4). The dispenser controller 60 controls the motor 35 for the dispenser 16 in accordance with this dispensing flow rate data for dispensing the paste from the dispensing opening 42 of the dispenser 16 at the predetermined dispensing flow rate. Accordingly, the dispenser controller 60 and the transfer table controller 86 control the dispenser 16 and transfer table 10 in accordance with data on dispensing flow rate and application pattern.

The application speed calculator 84 calculates application speed u which is the speed of paste dispensed from the application opening 57 of the application nozzle 18 based on the data on dispensing flow rate and nozzle size data which express the size of the application nozzle 18. This calculation result is sent to the evaluation unit 85 to determine whether the calculated application speed u conforms to the transfer speed of the application nozzle 18 under operation.

More specifically, if the application speed u of the paste dispensed from the application opening 57 of the application nozzle 18 is lower than the transfer speed of the application nozzle 18, dispensing of paste is slower than the transfer of nozzle, causing defective application such as smearing of the application line. The speed pattern memory 81a thus extracts the maximum transfer speed Vmax from the stored speed patterns and compare this Vmax with the application speed u to evaluate conformance. The evaluation results are sent to the display processor, and results are displayed on the display 69.

Other than displaying the evaluation results, the display processor 82 processes data stored in the second memory 78, and displays data used for actual application in a predetermined display format on the display 69. This enables the operator to always monitor application conditions for actual operation.

Figure 6:
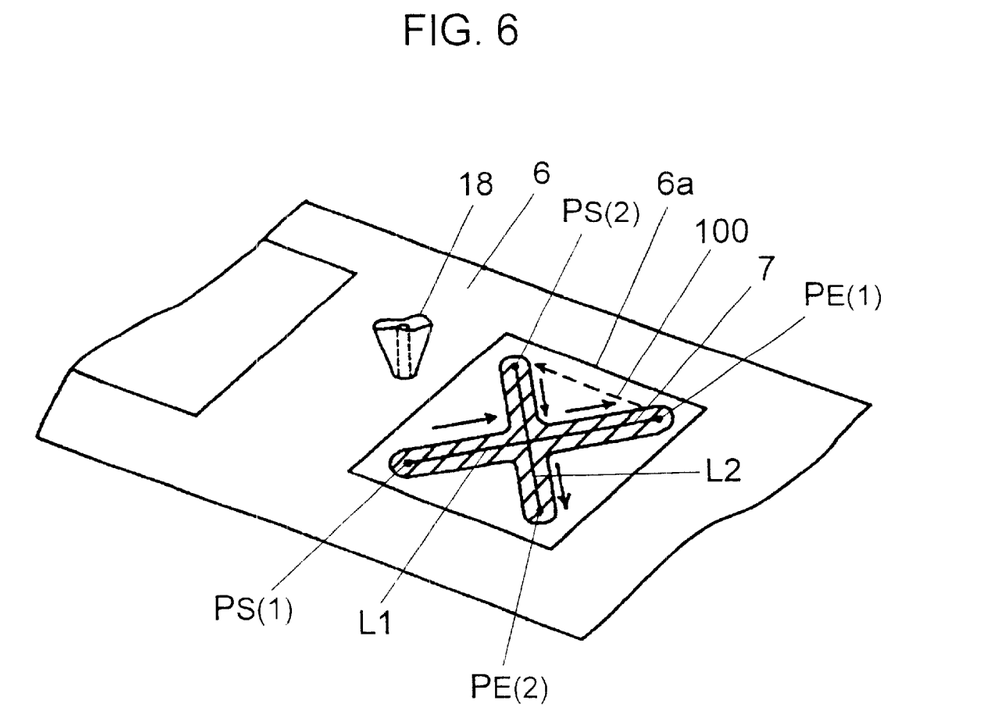
FIG. 6 is an explanatory diagram for a paste application pattern in accordance with the preferred embodiment of the present invention.
Figure 7:
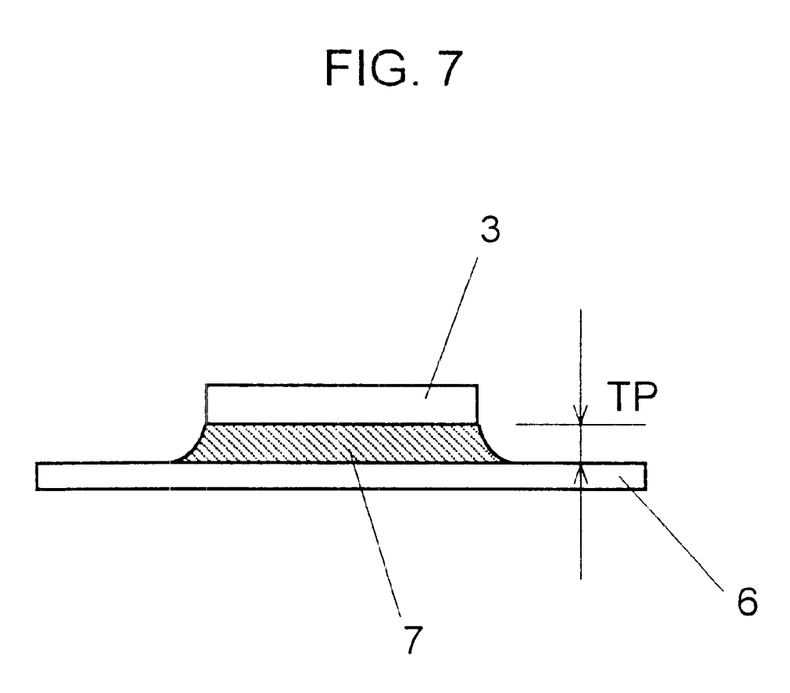
FIG. 7 is an explanatory diagram illustrating the state of a bonded chip in accordance with the preferred embodiment of the present invention.
Figure 8A:
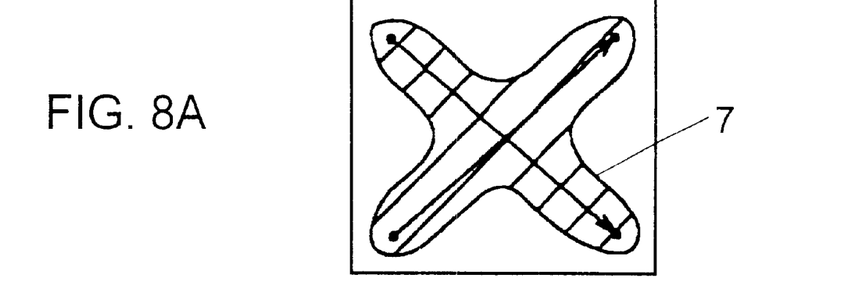
FIG. 8A is an explanatory diagram for a paste application pattern in accordance with the preferred embodiment of the present invention.
Figure 8B:
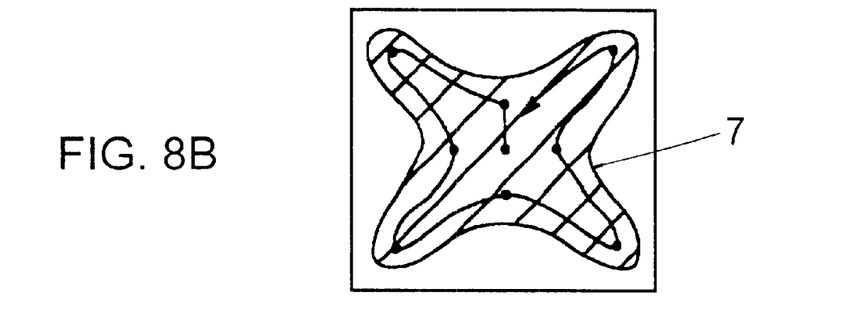
FIG. 8B is an explanatory diagram for a paste application pattern in accordance with the preferred embodiment of the present invention.
Figure 8C:
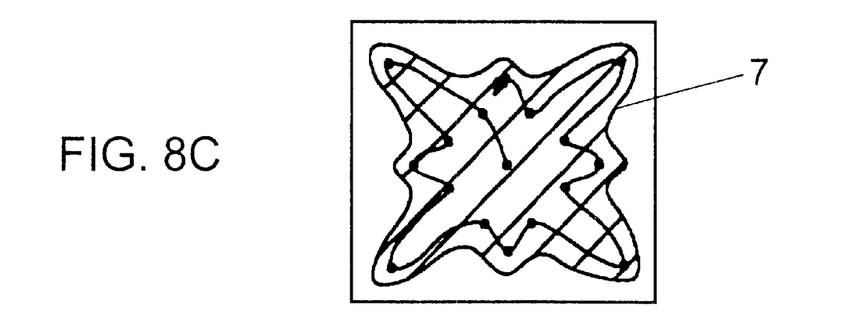
FIG. 8C is an explanatory diagram for a paste application pattern in accordance with the preferred embodiment of the present invention.
Figure 8D:
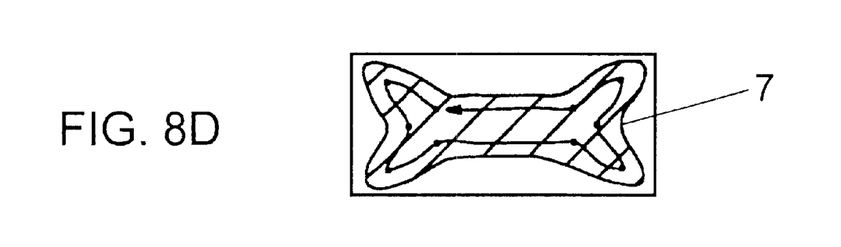
FIG. 8D is an explanatory diagram for a paste application pattern in accordance with the preferred embodiment of the present invention.

The die bonder is configured as described above. Next, paste application by the die bonder is described with reference to FIG. 6. In FIG. 6, a first application line L1 and second application line L2 composing the cross mark application pattern is set on the application area 6a on the lead frame 6. Each position of the first and second application lines L1 and L2 are identified by application start points PS(1) and PS(2), and application end points PE(1) and PE(2). This coordinates data is stored in the coordinates data memory 81b, and the application nozzle 18 moves along the first application line L1 and second application line L2. The speed pattern is stored in the speed pattern memory 81a.

In this application pattern, volume of the paste to be applied on the first and second application lines L1 and L2 is calculated based on the data on the size of application area 6a and paste thickness determined by the chip size, and this application volume is stored in the application volume memory 79. The dispensing flow rate data calculated from this application volume and application time is stored in the dispensing flow rate memory 80.

Application operation is described next. After positioning the lead frame 6 on the paste application unit 9, the application nozzle 18 is moved to the application start point PS(1) to start dispensing the paste by lowering the application nozzle 18 to a predetermined nozzle height. The paste is dispensed in response to a command from the controller 67. The dispenser controller 60 drives the dispenser 16 and the dispensing control valve driver 61 drives the dispensing control valve 19 to open the application opening 57. The dispenser 16 dispenses the paste at the predetermined dispensing flow rate stored in the dispensing flow rate memory 80 to pressure feed the paste to the application nozzle 18. This enables the application of a predetermined volume of the paste on each application line.

The application nozzle 18 moves toward the application end point PE(1) while dispensing the paste, and stops dispensing the paste when the application nozzle 18 reaches the application end point PE(1). The application nozzle 18 then moves to the application start point PS(2) of the application line L2 while stopping dispensing the paste (Refer to the broken arrow 100 in FIG. 6). The paste is dispensed again until the application end point PE(2). The application nozzle 18 stops dispensing the paste at this point and rises. This completes the paste application for one application area 6a.

In this paste application process, the following significant effects are desired by applying paste using the above application nozzle 18. First, the transfer speed can be made faster to achieve high-speed plotting and improve application efficiency by moving only the light and compact application nozzle 18.

The opening unit built into the application nozzle 18 provided immediately before the application opening 57 opens and closes the application opening 57 for dispensing or stopping the paste 7 from the application nozzle 18. This achieves extremely fast response when dispensing or stopping the paste. In addition, the stem 54 rises in the second space 56 provided immediately before the application opening 57 in the closing operation to stop dispensing. Accordingly, the paste 7 in the second space 56 is securely pulled back to stop dispensing from the application opening 57. This prevents the stringing phenomenon which occurs when dispensing a small portion of the paste after the dispensing stop command is given, which occurs in a conventional dispenser. Accordingly, the present invention enables the accurate control of paste dispensing start and stop for each application line, even for complicated plotting patterns.

Conventionally, one-stroke plotting is adopted for preventing defective application due to stringing of the paste. However, this results in increased application time because the dispensing opening follows the same application line several times. The present invention eliminates this disadvantage, and enables the plotting of more complicated application patterns in a shorter time. In addition, since rapid-response start and stop operation of dispensing is ensured, there is no need for extra stabilization time at the start and end points of application. Accordingly, the application nozzle 18 ensures highly efficient plotting application as well as high transfer speed.

In order to efficiently and accurately apply paste as described above, it is desirable to set the appropriate application pattern for each chip to be bonded. However, the preferred embodiment of the present invention requires the operator to simply specify a chip model when setting an application pattern, as described above. An appropriate paste application pattern for specified model is then set, and the paste is dispensed and the application nozzle moves in accordance with this selected pattern. Accordingly, the present invention eliminates the need for painstaking setting of data for each chip model, which may be required in the prior art, and thus improves operability of the paste applicator for chip bonding. At the same time, the setting of an appropriate application pattern secures high application quality.

The present invention calculates the dispensing flow rate of the dispenser based on data on application volume and data on application pattern of the paste applied to a substrate by the dispensing flow rate calculator, and controls the transfer table on which the dispenser and application nozzle move based on this calculated dispensing flow rate and data on application pattern. This improves operability of the paste applicator for chip bonding. High application quality is thus securable by always assuring appropriate a setting of application patterns.

REFERENCE NUMERALS 1 chip feeder
2 wafer sheet
3 chip
4 bonding head
4a nozzle of the bonding head 4
5 carrier
6 lead frame
6a application area
7 paste
8 bonding position 9 paste application unit
10 transfer table
11 Y axis table
11a Y axis motor
12 X axis table
12a X axis motor
13 bracket
14 Z axis table
14a Z axis motor
15 bracket
16 dispenser
17 tube
18 application nozzle
18a nozzle block
18b cover member
19 dispensing control valve
20 air tube
21 fixed plate
25 manifold block
26 syringe
26a lower end of the syringe 26
27 inner hole
27a space
27b inner hole
28 reciprocating mechanism
29 stem
29a sealing face
30 sealing member
31 space
31b inner hole
32 piston
33 sealing member
34 holding member
35 motor
36 feeding screw
37 nut
38 inner hole
39 reciprocating mechanism
40 stem
40a sealing face
42 dispensing opening
43 air source
44 control valve
50 cylinder
51 joint
52 spring
53 stepped inner hole
53a first space
53b clearance
53c valve sheet
54 valve stem
54a piston
54b sealing face
55 joint
56 second space
57 application opening
60 dispenser controller
61 dispensing control valve driver
62 Z axis motor driver
63 Y axis motor driver
64 X axis motor driver
65 bonding head driver
66 memory
67 controller
68 control panel
69 display
70 first memory
71 nozzle size data memory
72 paste thickness data memory
73 chip size data memory
74 application pattern data memory
74a reference coordinates data
74b reference speed pattern
75 application volume calculator
76 application pattern setting unit
76a magnifying and reducing processor
76b application pattern selector
77 input processor
78 second memory
79 application volume memory
80 dispensing flow rate memory
80a speed pattern memory
81 application pattern memory
81a speed pattern memory
81b coordinates data memory
82 display processor
83 dispensing flow rate calculator
84 application speed calculator
85 evaluation unit
86 transfer table controller
100 broken arrow
c coordinates data
t application time
u application speed
v speed pattern
Vmax maximum transfer speed
L1 first application line
L2 second application line
PS(1), PS(2) application start point
PE(1), PE(2) application end point
TP paste thickness

What is claimed is:

1. A paste applicator for die bonding, said paste applicator applying paste for adhering a semiconductor chip onto a substrate, and said paste applicator comprising:

an application nozzle having an application opening, said application nozzle dispensing said paste from said application opening to apply said paste to said substrate;

a transfer table for moving said application nozzle relative to said substrate; a dispenser which dispenses said paste to said application nozzle;

an application volume memory for storing data on application volume of said paste to be applied to said substrate;

an application pattern data memory for storing data corresponding to a plurality of application patterns for said paste to be applied in an application area of said substrate;

a chip size data memory for storing chip size data on a size of said semiconductor chip to be bonded;

an application pattern setting unit for calculating, based on the chip size data stored in said chip size data memory and said plurality of application patterns stored in said application pattern data memory, coordinates data c for specifying an application line, speed pattern v on a travel oath on which the application nozzle moves on the application line, and time t for applying said paste on said travel path;

a dispensing flow rate calculator for calculating a dispensing flow rate of said dispenser based on the data on application volume in said application volume memory and the data corresponding to a selected one of said patterns in said application pattern data memory;

a dispenser controller for controlling said dispenser based on the dispensing flow rate calculated by said dispensing flow rate calculator; and a transfer table controller for controlling said transfer table based on the coordinates data c and the speed pattern v.

2. The paste applicator for die bonding as defined in claim 1 further comprising:

a nozzle size data memory for storing data on a size of said application opening of said application nozzle; and an application speed calculator for calculating an application speed u of said paste dispensed from said application opening of said application nozzle based on the dispensing flow rate data calculated by said dispensing flow rate calculator and data in said nozzle size data memory.

3. The paste applicator for die bonding as defined in claim 2, selects an application pattern from said plurality of application patterns stored in said application pattern data memory, and adapts said selected application pattern by at least one of magnification and reduction to match the size of said semiconductor chip, based on the chip size data stored in said chip size data memory.

4. The paste applicator for die bonding as defined in claim 1 further comprising:

a coordinates data memory for storing said coordinates data c; and a speed pattern memory for storing said speed pattern v;

wherein said transfer table controller controls said transfer table based on said coordinates data c in said coordinates data memory and the speed pattern v in said speed pattern memory.

5. The paste applicator for die bonding as defined in claim 4 further comprising an evaluation unit which extracts a maximum speed Vmax from speed patterns stored in said speed pattern memory, compares said Vmax and said application speed u calculated by said application speed calculator, and evaluates as appropriate when said Vmax and said u satisfy a condition: u≧Vmax+α (α is a positive constant set for safety); and evaluates as inappropriate when said condition is unsatisfied.

6. The paste applicator for die bonding as defined in claim 1, wherein said dispensing flow rate calculator calculates dispensing flow rate of said dispenser based on data in said application volume memory and application time t in said application pattern setting unit.

7. The paste applicator for die bonding as defined in claim 1 further comprising:

a paste thickness data memory for storing data on paste thickness, for each chip to be bonded, between said substrate and said semiconductor chip after bonding; and an application volume calculator which calculates application volume of the paste to be applied to each application area of said substrate based on the paste thickness data stored in said paste thickness data memory and the chip size data stored in said chip size data memory, and outputs calculated data of application volume of paste to said application volume memory.

8. The paste applicator for die bonding as defined in claim 1, wherein said application nozzle is coupled with said dispenser by a tube, and said application nozzle is movable independent from said dispenser.

9. The paste applicator for die bonding as defined in claim 1, wherein said application nozzle has an opening unit for opening and closing said application opening, said opening unit being provided immediately before said application opening.

10. The paste applicator for die bonding as defined in claim 9, wherein opening and closing of said opening unit is controlled by a signal from said dispenser controller.

\* \* \* \* \*

UNITED STATES PATENT AND TRADEMARK OFFICE
CERTIFICATE OF CORRECTION

PATENT NO. : 6,685,777 B2
DATED : February 3, 2004
INVENTOR(S) : Sato et al.

It is certified that error appears in the above-identified patent and that said Letters Patent is hereby corrected as shown below:

Column 10,
Line 60, "oath" should read -- path --.

Column 11,
Line 18, after "2," insert -- wherein said application pattern setting unit: --

Signed and Sealed this

Twentieth Day of July, 2004

JON W. DUDAS
*Acting Director of the United States Patent and Trademark Office*